United States Patent [19]
Smith

[11] Patent Number: 6,008,696
[45] Date of Patent: Dec. 28, 1999

[54] LOW NOISE AMPLIFIER WITH ACTIVELY TERMINATED INPUT

[75] Inventor: Steven O. Smith, Loveland, Colo.

[73] Assignee: National Semiconductor Corporation, Santa Clara, Calif.

[21] Appl. No.: 09/064,233

[22] Filed: Apr. 21, 1998

[51] Int. Cl.⁶ .................................................. H03F 3/45
[52] U.S. Cl. .............................................. 330/260; 330/69
[58] Field of Search ........................... 330/260, 69, 258, 330/73, 108, 275, 301, 252

[56] References Cited

U.S. PATENT DOCUMENTS

| | | | |
|---|---|---|---|
| 4,296,383 | 10/1981 | Jeandot et al. | 330/301 |
| 4,472,689 | 9/1984 | Fukushima et al. | 330/306 |
| 4,638,260 | 1/1987 | Hamley | 330/254 |
| 5,361,038 | 11/1994 | Allen et al. | 330/54 |
| 5,614,864 | 3/1997 | Stubbe et al. | 330/69 |

*Primary Examiner*—Benny T. Lee
*Assistant Examiner*—Henry Choe
*Attorney, Agent, or Firm*—Skjerven, Morrill, MacPherson, Franklin & Friel; Edward C. Kwok

[57] ABSTRACT

An impedance matching circuit includes a differential amplifier providing a differential output signal across two output terminals. The differential amplifier receives the input signal whose input impedance is to be matched at one of the differential input terminals. The other one of the differential amplifier's input terminals is coupled to ground by a resistor. In one embodiment, feedback signal paths from the output terminals are provided by feedback resistors. In another embodiment, feedback signal paths from the output terminals are currents related by the ratio of the resistance of the resistor to the input impedance.

16 Claims, 2 Drawing Sheets

LOW NOISE AMPLIFIER WITH ACTIVELY TERMINATED INPUT

BACKGROUND OF THE INVENTION

1. Field of the Invention

The present invention relates to resistive termination of a transmission line. In particular, the present invention relates to providing resistive termination and gain in a low-noise amplifier.

2. Discussion of the Related Art

In some applications, a single-ended input signal is required to be matched to a 50 ohm input impedance and preamplified. FIG. 1 shows a circuit 100 in the prior art for terminating an input signal. In FIG. 1, the input signal and its associated input impedance $R_s$ are modeled by a voltage source 101 (with a variable voltage V) and by resistor 102. A fixed gain amplifier 103 and a resistor 104 provide both a gain and matching of the input impedance. Amplifier 103 is selected to have a fixed gain of −m over the operating frequency range and resistor 104 is selected to have a resistance $(m+1)R_s$, so that the negative feedback signal provided by resistor 104 clamps the input voltage at amplifier 103 at voltage V/2 (i.e., the input impedance is matched).

To provide a substantial gain, however, prior art circuit 100 requires a substantial current source in amplifier 103 to ensure linearity within the dynamic range of the input signal.

SUMMARY OF THE INVENTION

The present invention provides a method and a imple impedance matching circuit which matches the input impedance of a single-ended input signal and provides a differential output signal with gain.

In one embodiment, an input impedance matching circuit of the present invention includes: (a) a differential amplifier having a non-inverting input terminal receiving the input signal and an inverting input terminal, and providing a differential signal across a first output terminal and a second output terminal; (b) a first feedback signal path coupling the first output terminal of the differential amplifier to its non-inverting input terminal; (c) a second feedback signal path coupling the second output terminal of the differential amplifier to its inverting input terminal; and (d) a resistor coupling the inverting input terminal of the differential amplifier to a ground reference.

In one embodiment, the resistor has a resistance $R_x$, the first feedback signal path includes a second resistor of resistance n times the input impedance $R_s$, the second feedback signal path includes a third resistor having a resistance m times resistance $R_x$, and m approximates n−2.

According to a second embodiment of the present invention, the input impedance matching circuit's resistor has a resistance $R_x$, and the first and second feedback signal paths provide first and second currents $I_1$, and $I_2$, such that the ratio of the magnitudes of $I_1$ and $I_2$ approximates $R_x/R_s$. The currents in the first and second feedback signal paths are controlled by a differential pair receiving the differential output signal. In that embodiment, first and second output stages controlled by said differential output signal are provided. The currents in the first and second feedback signal paths are provided by first and second transistors each having a base terminal, respectively controlled by the currents of a differential pair. The first and second output stages have their respective input terminals coupled to the base terminals of said first and second transistors. Alternatively, an MOS switch can be provided in each output stage to enable or disable current flow in the output stage, so as to avoid excessive power dissipation due to a static current.

The present invention is better understood upon consideration of the detailed description below an accompanying drawings.

DETAILED DESCRIPTION OF THE PREFERRED EMBODIMENTS

Figure 2:
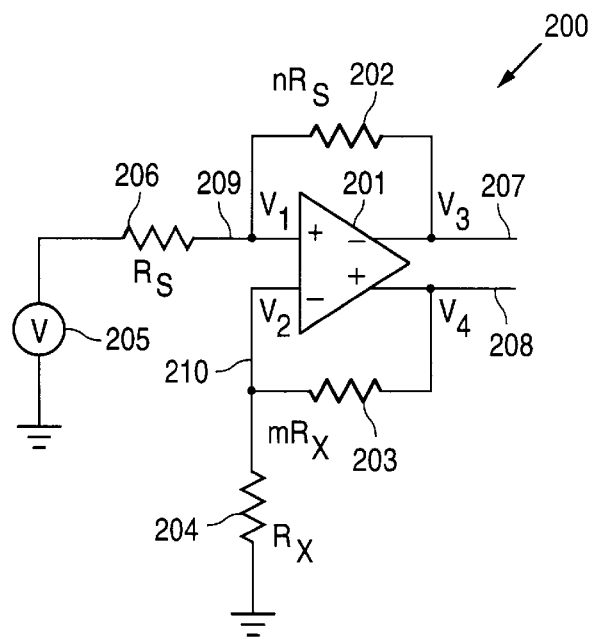
FIG. 2 shows schematically a circuit 200 in one embodiment of the present invention.

The present invention provides a differential output signal with a differential feedback, while matching the impedance of a single-ended input signal. One embodiment of the present invention is illustrated schematically by circuit 200 of FIG. 2.

Figure 1:
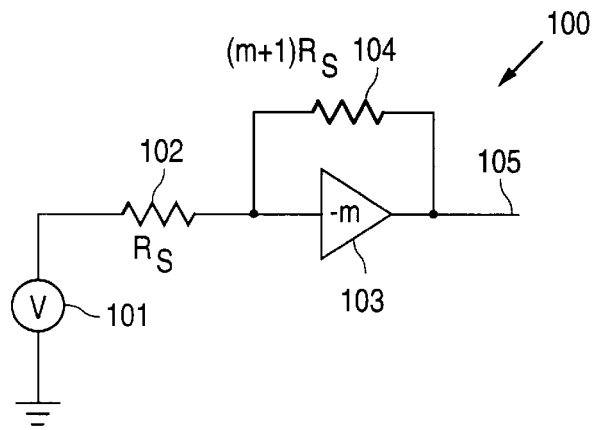
FIG. 1 shows a prior art circuit 100 using a negative feedback approach to provide input impedance matching and gain.

In circuit 200, an operational amplifier 201 receives an input signal at its non-inverting input terminal 209 and provides a differential output signal $V_o$ across output terminals 207 and 208. The inverting input terminal 210 of operational amplifier 201 is coupled to ground by a resistor 204 of resistance $R_x$. As in circuit 100 of FIG. 1, the input signal is modeled by a voltage source 205 with a variable voltage V and a resistor 206 of resistance $R_s$. Feedback resistors 202 (resistance $nR_s$) and 203 (resistance $mR_x$) are provided. To facilitate description of circuit 200's operations, the voltages relative to ground at terminals 209, 210, 207 and 208 are labeled $V_1$, $V_2$, $V_3$ and $V_4$ respectively. Operational amplifier 201 is selected to have a high loop gain and a high common mode rejection, so that $(V_1-V_2)$ and $(V_3+V_4)$ are both substantially zero volts. The following analysis shows that m and n can be selected to provide both matching of the impedance of the input signal and a gain.

First, since $$V_1 = \frac{n}{n+1}V_s + \frac{1}{n+1}V_3$$

and $$V_1 = V_2 = \frac{V_4}{m+1},$$

using the relation $V_3 = -V_4$, it can be shown that $$V_1 = \frac{V_s}{2}$$

(i.e., the input impedance of the input signal is matched), when m=n−2. Correspondingly, circuit 200 provides a gain of $$\frac{V_o}{V_s} = n - 1.$$

The effective input impedance can be selected by selecting the value $R_x$, given the value $R_s$.

Figure 3:
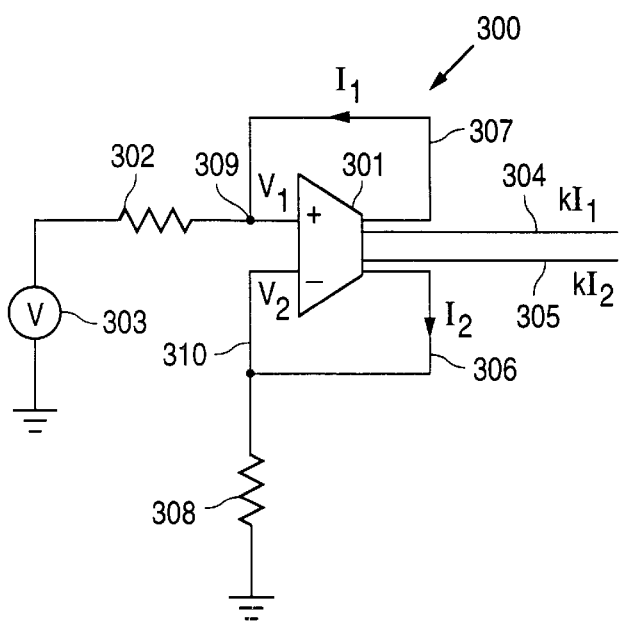
FIG. 3 shows schematically a circuit 300, which substitutes suitable feedback currents for feedback resistors, in accordance a second embodiment of the present invention.

If a differential output current, rather than a differential output voltage, is desired, the present invention allows the feedback resistors to be eliminated, if proper feedback currents can be provided. A second embodiment of the present invention which illustrates using feedback currents is provided in a circuit shown in FIG. 3. As shown in FIG. 3, the input signal is modeled by a resistor 302 of resistance $R_s$ and a voltage source of variable voltage V. Circuit 300 includes a differential amplifier 301, which receives the input signal at its non-inverting input terminal 309 and provides output currents $I_1$ and $I_2$ at terminals 307 and 306 respectively. The inverting input terminal 310 of amplifier 301 is coupled to ground through resistor 308 of resistance $R_x$. Additional currents with magnitudes related to feedback currents $I_1$ and $I_2$ can be provided by scaled current mirrors. Such additional currents are shown in circuit 300 at terminals 304 and 305. Impedance matching at input terminal 309 is achieved when:

$$I_1 = \frac{-V_s}{2R_s}.$$

Correspondingly, since the voltages at nodes 309 and 310 are equal due to the high loop gain of amplifier 301, current $$I_2 = \frac{-V_s}{2R_x}.$$

Thus, the magnitude of currents $I_1$ and $I_2$ is related by:

$$\frac{I_1}{I_2} = \frac{R_x}{R_s}.$$

Figure 4:
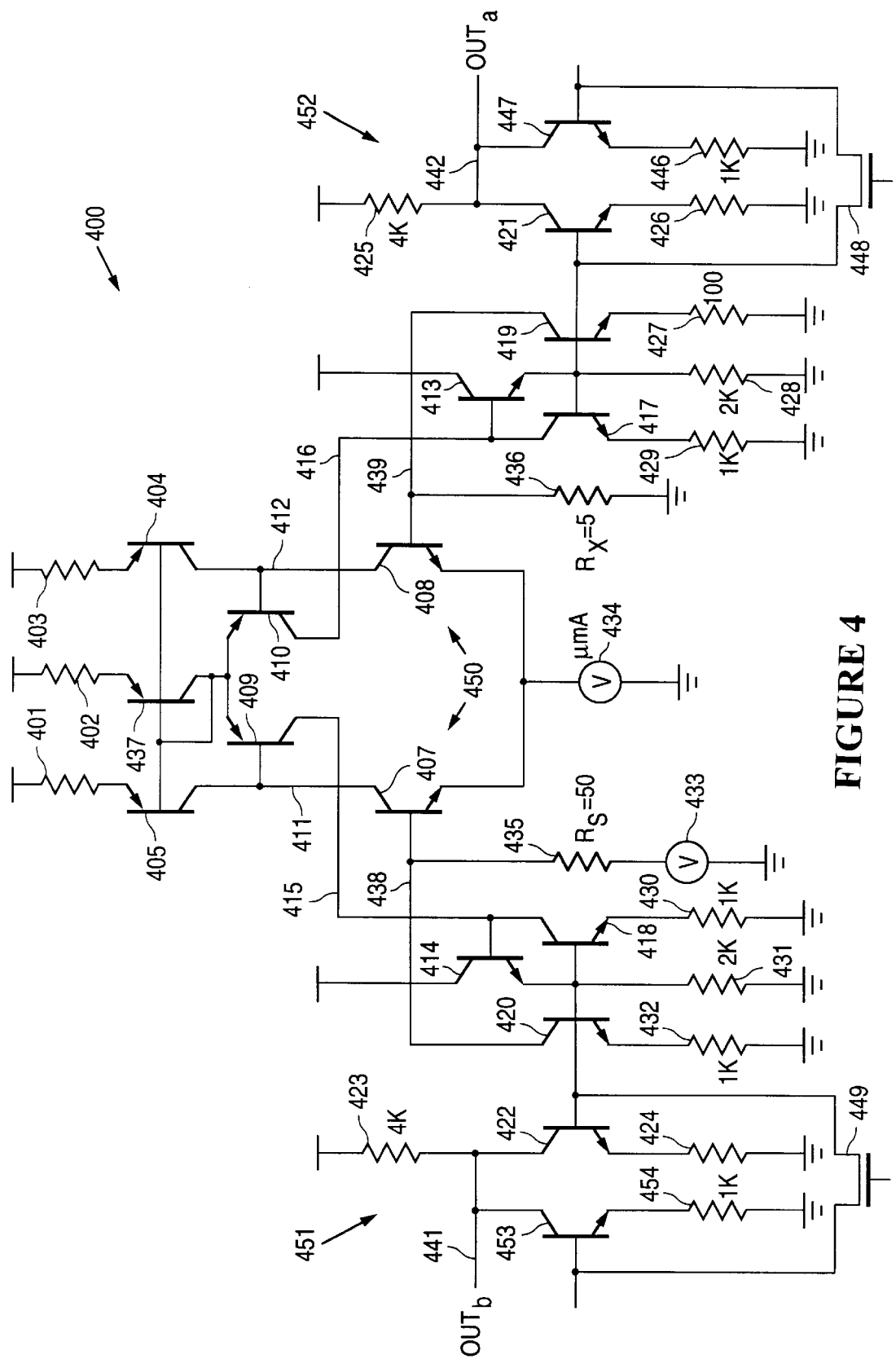
FIG. 4 shows circuit 400, which is one implementation of circuit 300 in accordance with the present invention.

One implementation of circuit 300 is provided in FIG. 4 as circuit 400. As shown in FIG. 4, the input signal is modeled by resistor 435 of resistance $R_s$ (in this embodiment, 50 ohms) and variable voltage source 433. This input signal is provided to one input terminal 438 of a differential amplifier 450, which includes NPN transistors 407 and 408, PNP transistors 404 and 405, resistors 401 and 403 (400 ohms each) and a current source 434 (4 mA). In this embodiment, NPN transistors 407 and 408 each have a gain ("beta") of approximately 70 and a base resistance of approximately 5 ohms. The other input terminal 439 of differential amplifier 450 is coupled to ground through resistor 436, with a resistance $R_x$ (in this embodiment, $R_x$ is selected to be 5 ohms). The differential output signal of differential amplifier 450 at terminals 411 and 412 controls two output currents at terminals 415 and 416 through a differential pair consisting of PNP transistors 409 and 410. The output currents at terminals 415 and 416 are supplied by a current in diode-connected PNP transistor 437, which is coupled to the supply voltage through resistor 402 (400 ohms). The output current at terminal 415, through NPN transistors 414 and 418 and resistors 430 (1 kohms) and 431 (2 kohms), controls the base terminal of NPN transistor 420 which, together with resistor 432 (1 kohms), provides a feedback current to input terminal 438 of differential amplifier 450. Similarly, the output current at terminal 416, through NPN transistors 413 and 417 and resistors 429 (1 kohms) and 428 (2 kohms), controls the base terminal of NPN transistor 419 which, together with resistor 427 (100 ohms), provides a feedback current to input terminal 439 of differential amplifier 450.

The voltages at the base terminals of NPN transistors 419 and 420 control also the output stages 451 and 452. Output stage 451 includes NPN transistor 422 and resistors 423 (4 kohms) and 424 (1 kohms). Similarly, output stage 452 includes NPN transistor 421 and resistors 425 (4 kohms) and 426 (1 kohms). Output stages 451 and 452 are controlled through the base terminals of NPN transistors 421 and 422 and provide a differential output current signal ($Out_b$–$Out_a$) in the respective collector terminals 441 and 442 of NPN transistors 421 and 422. The DC voltage levels of terminals 441 and 442 are set by resistors 425 (4 kohms), 426 (1 kohms), 423 (4 kohms) and 424 (1 kohms). Additional current signals can be provided by additional output stages coupled to the base terminals of NPN transistors 419 and 420, in the manner illustrated by output stages 451 and 452. For example, the gain of output stages 451 and 452 can be changed by switching in NPN transistors 447 and 453 by MOS transistors 448 and 449, which couple the base terminals of NPN transistors 447 and 453 to the base terminals of NPN transistors 421 and 422 respectively, thereby allowing currents to flow through additional resistors 446 and 454 (each 1 kohms). Under this arrangement, power dissipation is also minimized because current is switched on only when needed. In the present embodiment, other than NPN transistors 407 and 408, which each have a base resistance of 5 ohms, all transistors can be implemented by transistors having a beta of 70 and insignificant base resistance (e.g., 0–5 ohms).

Circuit 400 was simulated by a circuit simulator which indicated a noise figure of merit at 2.67 dB. The figure of merit improved to 2.05 dB, when current source 434 was set to provide 6 mA of current.

The above detailed description is provided to illustrate specific embodiments of the present invention and is not intended to be limiting. Numerous variations and modifications within the scope of the present invention are possible. The present invention is set forth in the accompanying claims.

I claim:

1. An input impedance matching circuit for matching an input impedance value $R_s$, comprising:

a differential amplifier having a non-inverting input terminal receiving an input signal and an inverting input terminal, and a first output terminal and a second output terminal together providing a differential output signal;

a first feedback signal path coupling said first output terminal of said differential amplifier to said non-inverting input terminal of said differential amplifier, said first feedback signal path provided such that said input impedance is matched at said non-inverting input terminal;

a second feedback signal path coupling said second output terminal of said differential amplifier to said inverting input terminal of said differential amplifier; and a resistor coupling said inverting input terminal of said differential amplifier to a ground reference.

2. An input impedance matching circuit as in claim 1, wherein said resistor has a resistance $R_x$, said first feedback signal path comprises a second resistor having a resistance n times said input impedance $R_s$, said second feedback signal path comprises a third resistor having a resistance m times said resistance $R_x$, and wherein m approximates n−2.

3. An input impedance matching circuit as in claim 1, wherein said resistor has a resistance $R_x$ and wherein said first and second feedback signal paths provide first and second currents $I_1$ and $I_2$, such that the ratio of the magnitudes of $I_1$ and $I_2$ approximates $R_x/R_s$.

4. An input impedance matching circuit as in claim 3, wherein currents in said first and second feedback signal paths are controlled by a differential pair receiving said differential output signal.

5. An input impedance matching circuit as in claim 4, further comprising first and second output stages controlled by said differential output signal.

6. An input impedance matching circuit as in claim 5, wherein said currents in said first and second feedback signal paths are provided by first and second transistors each having a base terminal, said base terminals of said first and second transistors being coupled to said differential output signal by currents in said differential pair.

7. An input impedance matching circuit as in claim 6, wherein said first and second output stages each having an input terminal, said input terminals of said first and second output stages being coupled respectively to the base terminals of said first and second transistors.

8. An input impedance matching circuit as in claim 5, said first output stage comprises an MOS switch for varying the gain of said output stage.

9. A method for matching an input impedance value $R_s$, comprising:

providing a differential amplifier having a non-inverting input terminal receiving an input signal and an inverting input terminal, and a first output terminal and a second output terminal together providing a differential output signal;

providing a first feedback signal path coupling said first output terminal of said differential amplifier to said non-inverting input terminal of said differential amplifier, said first feedback signal path provided such that said input impedance is matched at said non-inverting input terminal;

providing a second feedback signal path coupling said second output terminal of said differential amplifier to said inverting input terminal of said differential amplifier; and providing a resistor coupling said inverting input terminal of said differential amplifier to a ground reference.

10. A method as in claim 9, wherein said resistor has a resistance $R_x$, said steps of providing said first and second feedback signal paths provide a second resistor in said first feedback signal path having a resistance n times said input impedance $R_s$, a third resistor in said second feedback signal path having a resistance value m times said resistive value $R_x$, wherein m approximates n−2.

11. A method as in claim 9, wherein said resistor has a resistance $R_x$ and wherein said first and second feedback signal paths provide first and second currents $I_1$ and $I_2$, such that the ratio of the magnitudes of $I_1$ and $I_2$ approximates $R_x/R_s$.

12. A method as in claim 11, wherein currents in said first and second feedback signal paths are controlled by a differential pair receiving said differential output signal.

13. A method as in claim 12, further comprising providing first and second output stages controlled by said differential output signal.

14. A method as in claim 13, wherein said currents in said first and second feedback signal paths are provided by first and second transistors each having a base terminal, said base terminals of said first and second transistors being coupled to said differential output signal by currents in said differential pair.

15. A method as in claim 14, wherein said first and second output stages each having an input terminal, said input terminals of said first and second output stages being coupled respectively to the base terminals of said first and second transistors.

16. A method as in claim 13, said step of providing first output stage provides an MOS switch for varying the gain of said output stage.

* * * * *